United States Patent [19]
Ishijima

[11] Patent Number: 4,985,718
[45] Date of Patent: Jan. 15, 1991

[54] SEMICONDUCTOR MEMORY DEVICE OF ONE TRANSISTOR-ONE CAPACITOR MEMORY CELL TYPE

[75] Inventor: Toshiyuki Ishijima, Tokyo, Japan
[73] Assignee: NEC Corporation, Tokyo, Japan
[21] Appl. No.: 438,125
[22] Filed: Nov. 20, 1989
[30] Foreign Application Priority Data
  Nov. 18, 1988 [JP] Japan .................................. 63-291592
  Mar. 7, 1989 [JP] Japan .................................... 1-55345
[51] Int. Cl.⁵ .............................................. H01L 29/78
[52] U.S. Cl. ...................................... 357/23.6; 357/45; 357/46
[58] Field of Search ............................. 357/23.6, 46, 45

[56] References Cited
U.S. PATENT DOCUMENTS

| | | | |
|---|---|---|---|
| 4,612,629 | 9/1986 | Harari | 357/23.6 X |
| 4,649,406 | 3/1987 | Takemae et al. | 357/23.6 |
| 4,685,197 | 8/1987 | Tigelaar et al. | 357/23.6 X |
| 4,849,801 | 7/1989 | Honjyo et al. | 357/23.6 X |

FOREIGN PATENT DOCUMENTS
1100960  4/1989  Japan .................................... 357/23.6

OTHER PUBLICATIONS
M. Koyanagi et al., "Novel High Density, Stacked Capacitor MOS Ram", Int'l Electron Devices Meeting, 1978, pp. 348-351.

Primary Examiner—William Mintel
Attorney, Agent, or Firm—Sughrue, Mion, Zinn, Macpeak & Seas

[57] ABSTRACT

A semiconductor memory cell of one transistor - one capacitor memory cell type in which a storage capacitor of a first memory cell is formed on a switching transistor of a second memory cell as well as on a switching transistor of the first memory cell, and a storage capacitor of the second memory cell is formed on the switching transistor of the first memory cell as well as on the switching transistor of the second memory cell.

11 Claims, 9 Drawing Sheets

SEMICONDUCTOR MEMORY DEVICE OF ONE TRANSISTOR-ONE CAPACITOR MEMORY CELL TYPE

BACKGROUND OF THE INVENTION 1. (Field of the Invention)

The present invention relates to a semiconductor memory device having a plurality of memory cells of one transistor - one capacitor type, and more particularly, to the memory cell which has an improved capacitor structure.

2. (Description of Related Art)

A semiconductor memory cell, particularly, a memory cell of the type consisting of one transistor and one capacitor, adapted to; stores binary information in the form of electric charge has a small cell area and is therefore suited for a large capacity memory cell, of a high integration density. However as the memory cell size has become smaller with a higher integration density of a memory cell, the capacitor area in the cell structure has become smaller too. The decrease in the storage charge due to the decrease in the capacitor area invites a problem in immunity against α particles and causes a deterioration in sensitivity of a sense amplifier.

Technologies for forming a large storage capacitance irrespective of the decrease in the memory cell area have heretofore been proposed in order to solve the problems described above. For example, the article entitled "NOVEL HIGH DENSITY, STACKED CAPACITOR MOSRAM" by M. Koyanagi et al. and published in the Proceedings of the International Electron Devices Meeting, 1978, pp. 348–351 discloses a structure wherein the storage capacitor includes two layers of polycrystalline. The first silicon layer is electrically connected to the source electrode of a switching transistor and the second layer is kept at a predetermined potential as the opposite electrode of the first layer. The of charge stored in this memory cell is determined by the area of the first and second layers and they are stacked together on the switching transistor of the same memory cell. Therefore, the capacitance and accordingly the charge can be enhanced to some extent.

However, the conventional structure proposed in the papers cannot have a sufficient capacitance when the memory cell area is further reduced permitting higher integration of the memory cells, because its capacitor-forming polycrystalline silicon layers are formed only on one switching transistor belonging to the same memory cell and only on a portion of a field insulating layer near the switching transistor.

SUMMARY OF THE INVENTION:

Accordingly, one object of the present invention is to provide a semiconductor memory device of one transistor - one capacitor cell type in which the storage capacitor can have a capacitance large enough to permit a high integration density.

Another object of the present invention is to provide a method for efficiently manufacturing the above mentioned device of the present invention.

According to the present invention, there is provided a semiconductor memory device having a plurality of semiconductor memory cells of one transistor - one capacitor type which comprises a semiconductor substrate of a first conductivity type, the substrate having a major surface and including a first and a second transistor forming portions; first and second impurity regions of a second conductivity type opposite to the first conductivity type formed in the major surface of the first transistor forming portion; a third and a fourth impurity regions of the second conductivity type formed in the major surface of the second transistor forming portion; a first insulating layer formed on the first to fourth impurity regions; a first gate insulating film formed on the major surface between the first and second impurity regions; a second gate insulating film formed on the major surface between the third and fourth impurity regions; a first gate electrode formed on the first gate insulating film and covered by an insulating film; a second gate electrode formed on the second gate insulating film and covered by an insulating film; a first capacitor electrode electrically connected to the second impurity region and formed on the first and second transistor forming portions; a first dielectric film formed on the first capacitor electrode; a common capacitor electrode formed on the first dielectric film; a second dielectric film formed on the common capacitor electrode; a second capacitor electrode electrically connected to the fourth impurity region, formed on the second dielectric film and on the first and second transistor forming portions; an inter-ply insulating layer formed on the second capacitor electrode; and a bit line formed on the interply insulating layer and electrically connected to the first and third impurity regions; whereby a first semiconductor memory cell is constructed by a first switching transistor and a first storage capacitor in which the first switching transistor is constituted by the first impurity region serving as one of source and drain regions, the second impurity region serving as the other of the source and drain regions, the first gate insulating film and the first gate electrode, and in which the first storage capacitor is constituted of the first capacitor electrode, the first dielectric film and the common capacitor electrode, and whereby a second semiconductor memory cell is constructed by a second switching transistor and a second storage capacitor in which the second switching transistor is constituted of the third impurity region serving as one of source and drain regions, the fourth impurity region serving as the other of source and drain regions, the second gate insulating film and the second gate electrode, and in which the second storage capacitor is constituted of the second capacitor electrode, the second dielectric film and the common electrode. Each of the storage capacitors is formed on the transistor of the partner as well as on the transistor of self. Therefore, a large capacitance can be obtained. When the first and the second transistor forming portions are positioned in the same active region of the substrate, the first and the third impurity regions are continuously formed at a center of the active region. In this case, the first and the second storage capacitors can be entirely formed on the active region; that is, on the entire areas of the first and second transistor forming portions. On the other hand, when the first and rewind transistor portions belong to separate active regions which are separated from each other by a field insulating layer, the first and the second storage capacitors can be entirely formed on the field insulating layer between these active regions.

According to another aspect of the present invention, there is provided a method of manufacturing a semiconductor memory device having a plurality of memory cells each including a switching transistor and a storage capacitor. The method comprises the steps of; forming a first and a second switching transistors on a semiconductor substrate each having the source and drain regions; forming a first capacitor electrode on the first and second transistors, the first capacitor electrode being electrically connected only to one of the source and drain regions of the first transistor; forming a first dielectric film on the first capacitor electrode; forming a common capacitor electrode on the first dielectric film; forming a second dielectric film on the common capacitor electrode; forming a first silicon film on the second dielectric film; forming a contact hole in the first silicon film, in the second dielectric film, in the common capacitor electrode, in the first dielectric film and in the first capacitor electrode in sequence to expose a part of one of the source and drain regions of the second transistors; forming an insulating layer entirely on the first silicon film and in the contact hole; subjecting the insulating layer to a reactive anisotropic ion etching to retain the insulating layer only on the side wall of the contact hole and to remove other portions of the insulating layer completely; forming a second silicon film on the first silicon film and in the contact hole to fill the contact hole completely; and forming a second capacitor electrode on the first and second transistors from the first and second silicon films, the second capacitor electrode being electrically connected only to that one of the source and drain regions of the second transistor. The second capacitor electrode is made of first and second silicon films in which the first silicon film is used as an etching stopper film at the reactive anisotropic ion etching and as a protection film to protect the second dielectric film during the ion etching, and the second silicon film is used for filling the contact hole.

Figure 1:
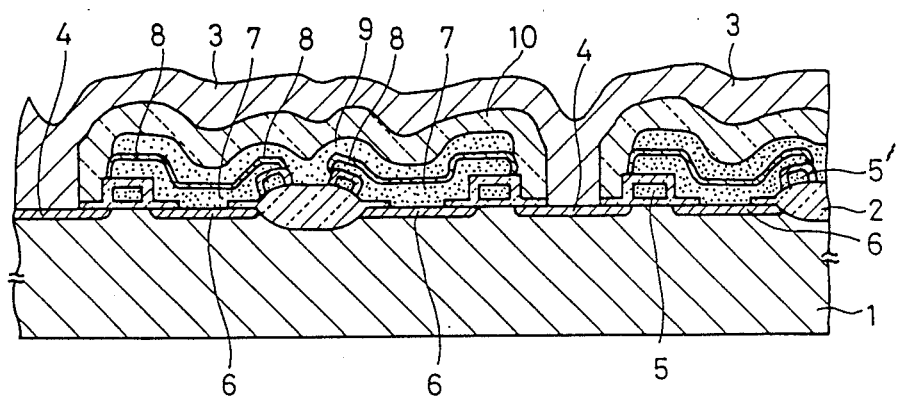
FIG. 1 is a cross-sectional view showing a conventional semiconductor memory device.

DESCRIPTION OF A PRIOR ART:

Referring to FIG. 1, a pair of memory cells are formed in and on an active region of a P-type silicon substrate 1. Each of the memory cells includes a switching transistor constituted by an N+-type common drain (or source) region 4 connected to a bit line 3, an N+-type source (or drain) region 6, a gate electrode 5 and a gate insulating film under the gate electrode, and a storage capacitor constituted by a lower electrode 7 connected to the source (or drain) region 6, a dielectric film 8 formed on the lower electrode 7 and an upper electrode 9 formed on the dielectric film 8 and covered by an inter-ply insulating layer 10. Wirings 5' on the field insulating layer 2 are word lines continuously connected to gate electrodes of other memory cells (not shown in FIG. 1). The lower electrode 7 of the storage capacitor is formed on the source (or drain) region 6, on the gate electrode 5 of the same memory cell and on a part of the field insulating layer near the source (or drain) region 6, but it is absent on a switching transistor of another memory cell. Therefore, the capacitance of the storage capacitor cannot be increased.

DETAILED DESCRIPTION OF EMBODIMENTS:

(First Embodiment)

Figure 2A:
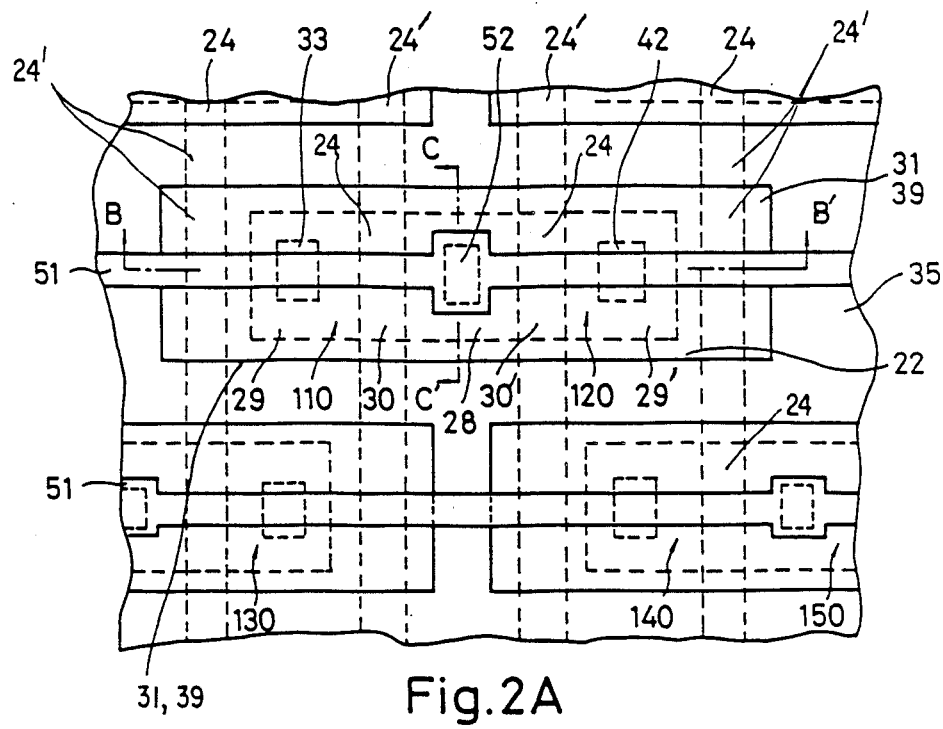
FIG. 2A is a plan view showing a first embodiment of the present invention.
Figure 2B:
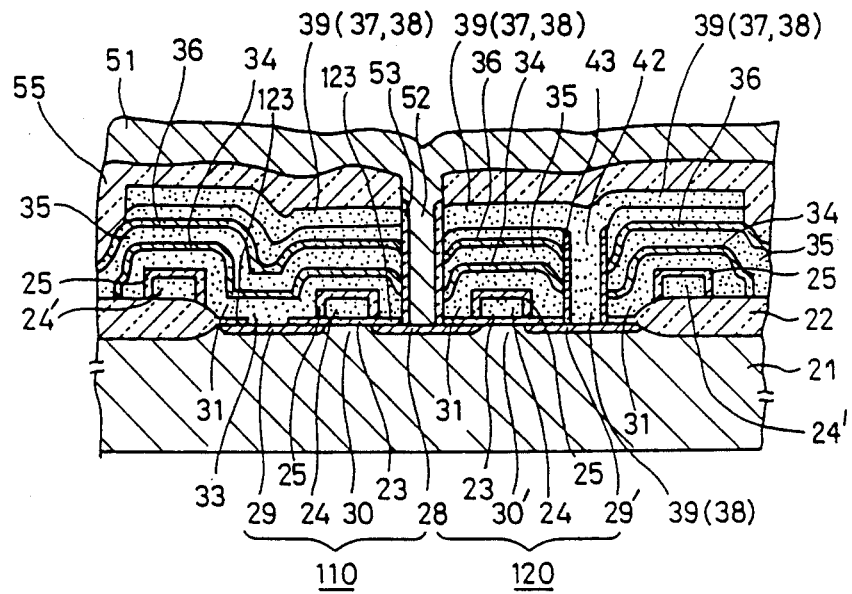
FIGS. 2B and 2C are cross-sectional views taken along lines B—B' and C—C' in FIG. 2A as viewed in the direction of arrows, respectively.
Figure 2C:
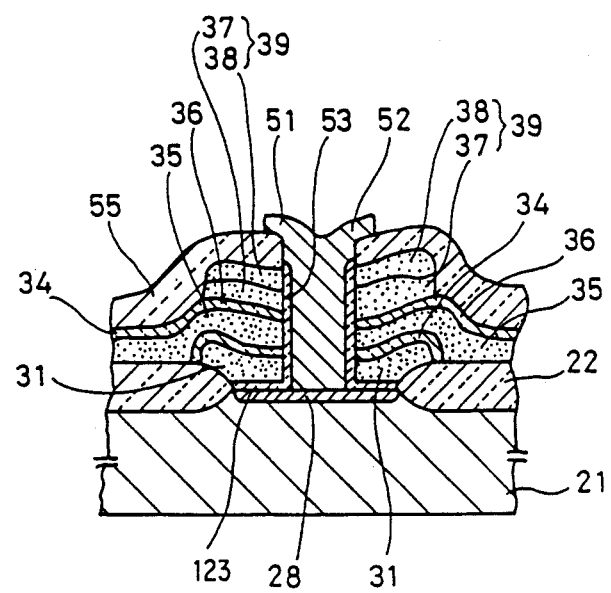

Referring to FIGS. 2A to 2C, a first embodiment of the present invention will be described. A plurality of word lines 24' and a plurality of bit lines 51 are formed on a P-type silicon substrate 21, and a plurality of semiconductor memory cells, for example, 110, 120, 130, 140 and 150 are arranged in a matrix form each coupled to corresponding bit and word lines. On the major surface of the P-type silicon substrate 21, a thick field silicon oxide layer 22 is selectively formed to surround respective active regions of the substrate, and in each of the active regions, a pair of transistor forming regions for forming switching transistors of a pair of memory cells (for example, 110 and 120) are formed. In the active region, an N+-type common drain (or source) region 28 and first and second N+-type source (or drain) regions 29, 29' are formed. On the first and second channel regions 30, 30', gate electrodes 24, 24 made of polycrystalline silicon are formed via gate insulating films 23, respectively, and on the major surface of the substrate other than the channel regions, a silicon oxide layer 123 is formed so as to cover the N+-type impurity regions 28, 29, 29'. Every gate electrode 24 is continuously formed with the word line 24', and every word line 24', which includes gate electrodes 24 is covered with a silicon oxide film 25. Thus a switching transistor of the first memory cell 110 is composed of the first source (or drain) region 29, the common drain (or source) region 28, the first channel region 30, the gate insulating film 23 on the first channel region and the gate electrode 24 on the first channel region, and a switching transistor of the second memory cell 120 is composed of the second source (or drain) region 29', the common drain (or source) region 28, the second channel region 30', the gate insulating film 23 on the second channel region and the gate electrode 24 on the second channel region. A first capacitor electrode 31 made of polycrystalline silicon and having a rectangular plan shape is connected to the first source (or drain) region 29 through a contact hole 33 in the first insulating layer 123, and is entirely formed on the active region, that is, entirely formed on the first and second switching transistors, and on parts of the field insulating layer 22 near the active region with a ring-like plan shape. A first dielectric film 34 composed of silicon oxide film and/or silicon nitride film is formed on the entire upper and side surfaces of the first capacitor electrode 31, and a common capacitor electrode 35 made of polycrystalline silicon is formed on the entire first dielectric film 34. The common capacitor electrode 35 is continuously formed with other common electrodes of other pairs of memory cells, and to the common capacitor electrode a fixed potential such as ground potential (zero volts) is applied. A second dielectric film 36 composed of silicon oxide film and/or silicon nitride film is formed on the entire common electrode 35, and a second capacitor electrode 39 consisting of polycrystalline silicon films 37, 38 is formed on the second dielectric film 36 and stacked only on the first capacitor electrode 31 with the same rectangular plan shape as the first capacitor electrode so that the second capacitor electrode 39 also entirely covers the first and second switching transistors. The second capacitor electrode 39 is brought into contact with the second source (or drain) region 29' through a contact hole 42 surrounded by a silicon oxide layer 43 which covers at least the side walls of the common capacitor electrode 35 and of the first capacitor electrode 31 in the contact hole 42. Thus a storage capacitor of the first memory cell 110 is composed of the first capacitor electrode 31, the first dielectric film 34 and the common capacitor electrode 35, and a storage capacitor of the second memory cell 120 is composed of the second capacitor electrode 39, the second dielectric film 36 and the common capacitor electrode 35. Therefore, both of the storage capacitors of the first and second memory cells are laid on both of the switching transistors of the first and second memory cells, respectively. An interply insulating layer 55 made of phosphosilicate glass or silicon nitride covering the second capacitor electrode 39 is entirely formed, and a bit line 51 made of aluminum or aluminum-silicon alloy is formed on the inter-ply insulating layer 55 and connected to the common drain (or source) region through a contact hole 52 which is formed in the inter-ply insulating layer 55, in the capacitor electrodes 39, 35, 31, in the dielectric films 36, 34 and in the silicon oxide layer 123, and is surrounded by a silicon oxide layer 53 covering at least side walls of capacitor electrodes 39, 35, 31 in the contact hole 52.

Figure 3A:
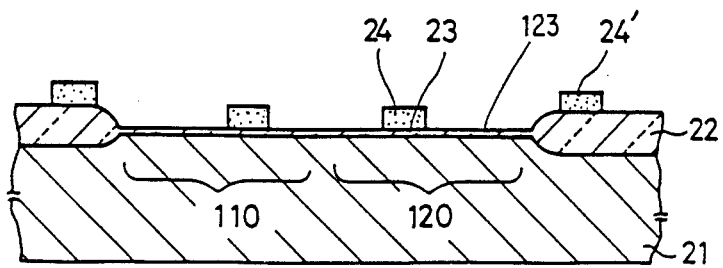
FIGS. 3A to 3H are cross-sectional views showing sequentially the steps of the process for manufacturing the first embodiment.
Figure 3B:
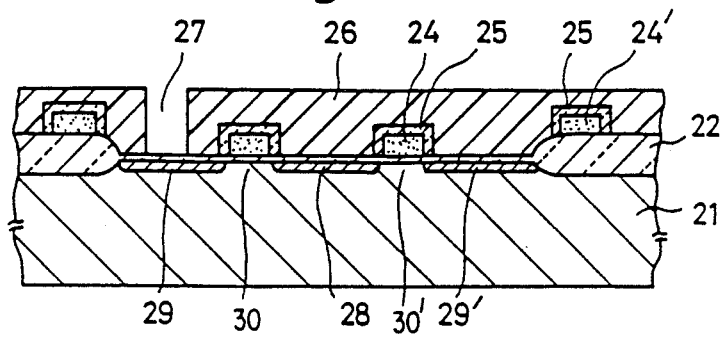
Figure 3C:
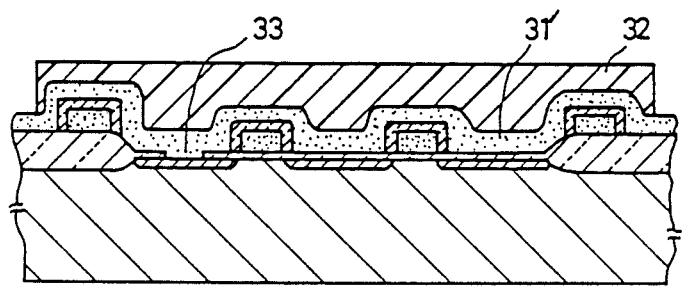
Figure 3D:
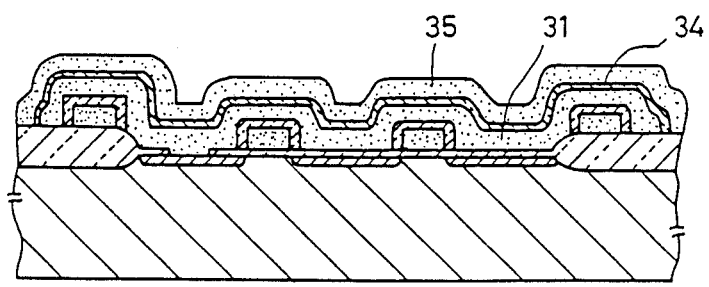
Figure 3E:
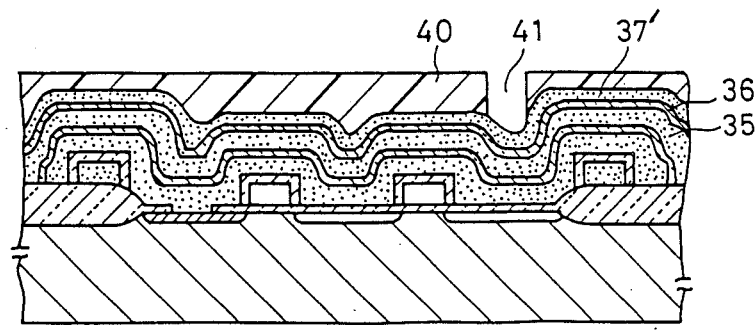
Figure 3F:
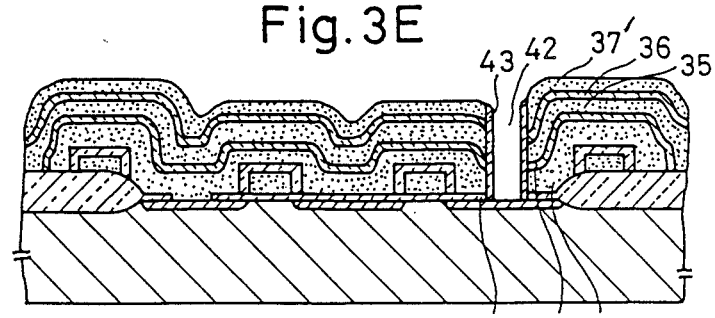
Figure 3G:
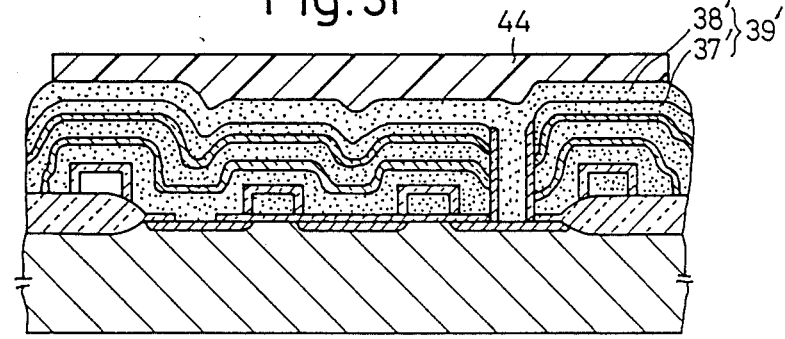
Figure 3H:
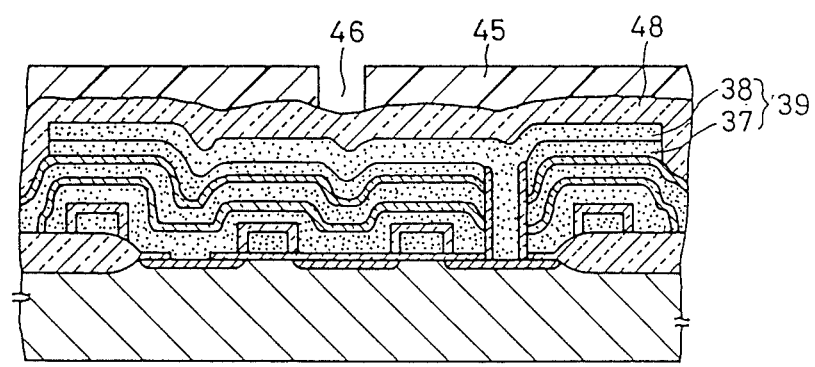

Next, a method of manufacturing the first embodiment will be described. At first, the thick field silicon oxide layer 22 is selectively, thermally formed on the P-type silicon substrate 21, and on the major surface of the active region, gate insulating films 23 and the silicon oxide layer 123, which is thicker than the gate insulating films 23 although in the drawings they are drawn as the same thickness, are formed. The films 123 must be grown in such a film thickness that capacitance coupling or undesirable direct contact does not occur between the first capacitor electrode 31 and the N+-type impurity regions 28, 29' in FIG. 2. Then, the word lines 24' including gate electrodes 24 are formed by first level polycrystalline silicon layer (FIG. 3A). Next, the N+-type regions 28, 29, 29' serving as source and drain regions are formed through an ion implantation of arsenic or phosphorus ions followed annealing, by using gate electrodes 24 and the field insulating layer 22 as a mask. After forming silicon oxide film 25, which has a film thickness such that capacitance coupling or undesirable direct contact does not occur between the gate electrodes (word lines) 24, 24' and the first capacitor electrode 31 in FIG. 2, on the gate electrodes also on the word lines by a thermal oxidation method or a CVD method, a first photoresist mask pattern 26 having an aperture 27 is formed (FIG. 3B). Next, the silicon oxide layer 123 is selectively etched under the aperture 27 using the first photoresist mask pattern to form the contact hole 33. After removing the first photoresist mask pattern 26, a polycrystalline silicon layer 31' of second polycrystalline silicon level is entirely formed, and N-type impurities are introduced into the silicon layer 31' by a thermal diffusion method or an ion implantation method. A second photoresist mask pattern 32 is formed (FIG. 3C). Next, the first capacitor electrode 31 is formed by selectively etching the silicon layer 31' using the second photoresist mask pattern 32. After removing the mask pattern 32, the first thin dielectric film 34 is formed on the first capacitor electrode 31 by a thermal oxidation method or a CVD method. Then, a third level polycrystalline silicon layer is deposited by a CVD method, and N-type impurities are introduced into the silicon layer by a thermal diffusion method or an ion implantation method to form the common capacitor electrode 35 (FIG. 3D). Next, the second thin dielectric film 36 is formed on the common capacitor electrode 35 by a thermal oxidation method or a CVD method, and a first polycrystalline film 37' is entirely formed. Then, a third photoresist mask pattern 40 having an aperture 41 is formed sequentially (FIG. 3E). Next, the contact hole 42 is formed in the first silicon film 37', in the second dielectric film 36, in the common capacitor electrode 35, in the first dielectric film 34, in the first capacitor electrode 31 and in the silicon oxide layer 123 under the aperture 41 by using the photoresist pattern 40 as a mask through a reactive anisotropic ion etching. After removing the photoresist pattern 40, a silicon oxide layer is entirely formed by a thermal oxidation method or a CVD method, and a reactive anisotropic ion etching is conducted to the silicon oxide layer to retain the silicon oxide layer 43 only on the side wall of the contact hole 42 (FIG. 3F). The silicon oxide layer 43 must have such a film thickness from the side wall that capacitance coupling or undesirable direct contact does not occur in the contact hole between the second capacitor electrode 39 and the first and common capacitor electrodes 31, 35 in FIG. 2. Next, the entire surface of a second polycrystalline silicon film 38' is entirely deposited by a CVD method so as to fill the contact hole 42 completely. Then N-type impurities are introduced into the fourth level polycrystalline silicon layer 39' consisting of films 37', 38' by a thermal diffusion method or an ion implantation method. Then, a fourth photoresist mask pattern 44 is formed (FIG. 3G). Next, the silicon layer 39' is selectively etched by using the fourth photoresist mask pattern 44 to form the second capacitor electrode 39. After removing the fourth photoresist mask pattern 44, the inter-ply insulating layer 48 is deposited by a CVD method, and fifth a photoresist mask pattern 45 having an aperture 46 is formed (FIG. 3H). Thereafter, the contact hole 52 is formed sequentially in the inter-ply insulating layer 55, in the second capacitor electrode 39, in the second dielectric film 36, in the common capacitor electrode 35, in the first dielectric film 34, in the first capacitor electrode 31 and the silicon oxide layer 123 under the aperture 46 by using the photoresist pattern 45 as a mask through a reactive anisotropic ion etching method. After removing the photoresist pattern 45, a silicon oxide layer is entirely formed by a thermal oxidation method or a CVD method, and a reactive anisotropic ion etching is conducted to the silicon oxide layer to retain the silicon oxide layer 53 only on the side wall of the contact hole 52.

The silicon oxide layer 53 must have in such a film thickness from the side wall that such capacitance coupling or undesirable direct contact does not occur in the contact hole between the bit line 51 and the capacitor electrodes 39, 35, 31. Then, the metallic bit line 51 is formed on the interply insulating layer 55 and is connected to the common drain (or source) region 28 through the contact hole 52 to establish the structure shown in FIG. 2.

(Second Embodiment)

Figure 4A:
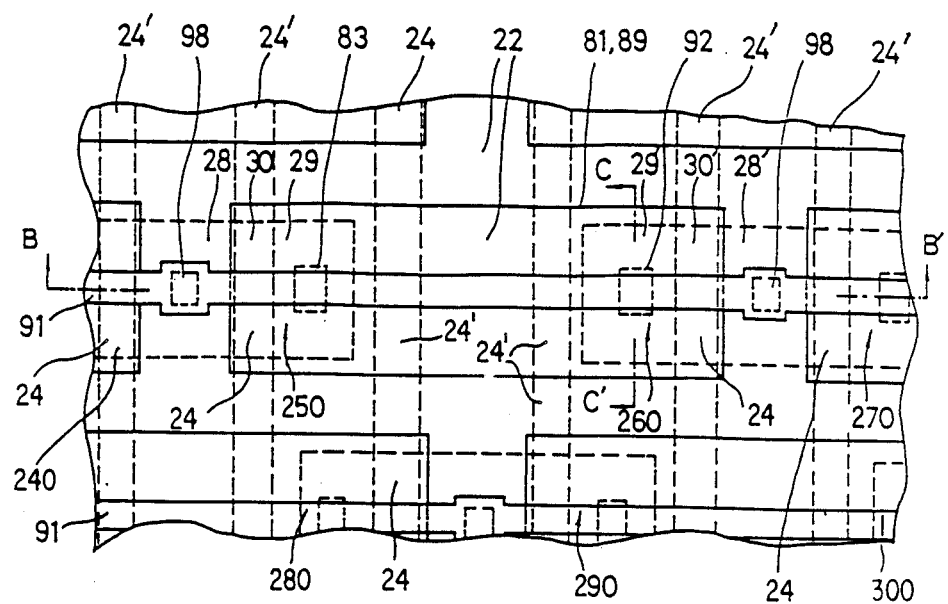
FIG. 4A is a plan view showing a second embodiment of the present invention.
Figure 4B:
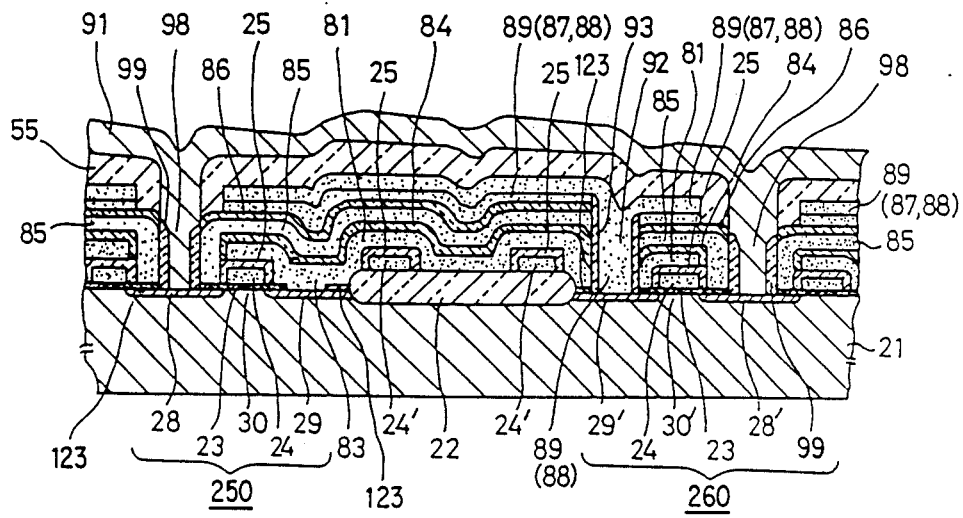
FIGS. 4B and 4C are cross-sectional views taken along lines B—B' and C—C' in FIG. 4A as viewed in the direction of the arrows, respectively.
Figure 4C:
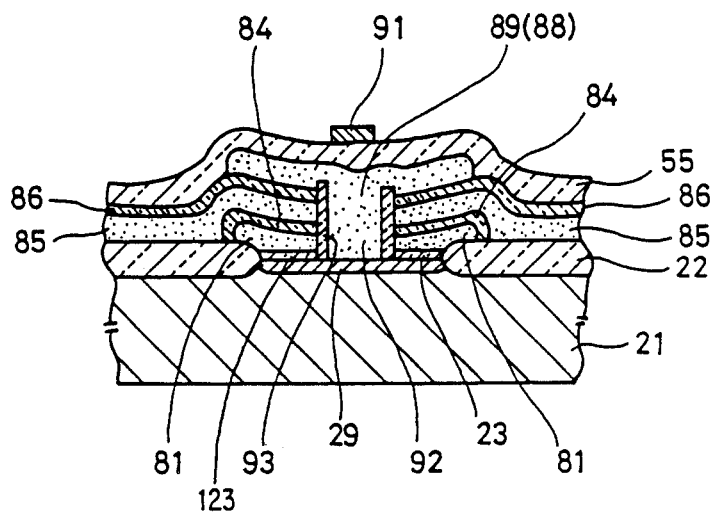

Referring to FIGS. 4A to 4C, a second embodiment of the present invention will be described. A plurality of word lines 24' and a plurality of bit lines 91 are formed on a P-type silicon substrate 21, and a plurality of semiconductor memory cells, for example, 240, 250, 260, 270, 280, 290 and 300 are arranged in a matrix form each coupled to corresponding bit and word lines. On the major surface of the P-type silicon substrate 21, a thick field silicon oxide layer 22 is selectively formed to surround respective active regions of the substrate, and in each of the active regions, a pair of transistor forming regions for forming switching transistors of a pair of memory cells (for example, 240 and 250, 260 and 270) are formed. In a first active region, an N+-type common drain (or source) region 28 and an N+-type source (or drain) region 29 are formed. On a channel region 30 between the regions 28, 29, a gate silicon oxide film 23 and a polycrystalline silicon gate electrode 24 are formed sequentially. Thus a switching transistor of the first memory cell 250 is constituted. On the other hand, in a second active region which is separated from the first active region by the thick field insulating layer 22, an N+-type common drain (or source) region 28' and an N+-type source (or drain) region 29' are formed. On a channel region 30' between the regions 28', 29', a gate silicon oxide film 23 and a polycrystalline silicon gate electrode 24 are sequentially formed. Thus, a switching transistor of the second memory cell 260 is constituted. On the major surface of the substrate other than the channel regions, a silicon oxide layer 123 is formed so as to cover the N+-type impurity regions 28, 29, 28', 29'. Every gate electrode 24 is continuously formed with the the word line 24', that is, a part of word line, and every word line 24' including gate electrodes 24 is covered with a silicon oxide film 25. A first capacitor electrode 81 made of a second level polycrystalline silicon is connected to the source (or drain) region 29 through a contact hole 83 in the insulating layer 123, and is formed on the gate electrodes 24, 24' and the source (or drain) regions 29, 29' of the switching transistors of the first and second memory cells 250, 260 and further on the thick field insulating layer 22 between the first and second active regions continuously, with a rectangular plan shape. A first dielectric film 84 composed of silicon oxide film and/or silicon nitride film is formed on the entire upper and entire side surfaces of the first capacitor electrode 81, and a common capacitor electrode 85 made of a third level polycrystalline silicon is formed on the entire surface of the first dielectric film 84. The common capacitor electrode 85 is continuously formed with other common electrodes of other pairs of memory cells, and to the common capacitor electrode a fixed potential such as ground potential (zero volts) is applied. A second dielectric film 86 composed of silicon oxide film and/or silicon nitride film is formed on the entire surface of the common capacitor electrode 85, and a second capacitor electrode 89 consisting of polycrystalline silicon films 87, 88 is formed on the second dielectric film 86 and stacked on the first capacitor electrode 81 with the same rectangular plan shape as the first capacitor electrode so that the second capacitor electrode 85 is also formed on the switching transistors of the first and second memory cells 250, 260 and on the field insulating layer 22 therebetween. The second capacitor electrode 89 is brought into contact with the source (or drain) region 29' through a contact hole 92 surrounded by a silicon oxide layer 93 which covers at least the side walls of the common electrode 85 and of the first capacitor electrode 81 in the contact hole 92. Thus a storage capacitor of the first memory cell 250 is composed of the first capacitor electrode 81, the first dielectric film 84 and the common capacitor electrode 85, and a storage capacitor of the second memory cell 260 is composed of the second capacitor electrode 89, the second dielectric film 86 and the common electrode 85. Therefore, both of the storage capacitors of the first and second memory cells are laid on both of the switching transistors of the first and second memory cells, respectively, and on the field insulating layer 22 therebetween. An inter-ply insulating layer 55 made of phosphosilicate glass or silicon nitride covering the second capacitor electrode 89 is entirely formed, and a bit line 91 made of aluminum or aluminum-silicon alloy is formed on the inter-ply insulating layer 55 and connected to the common drain (or source) regions 28, 28', respectively, through contact holes 98 which are formed in the inter-ply insulating layer 55, in the common capacitor electrode 85, in the second dielectric film 86 and in the silicon oxide layer 123, and is surrounded by a silicon oxide layers 99 covering at least side walls of the common capacitor electrode 85 in the contact holes 98. The silicon oxide layer 123 has such a film thickness that electrical interaction does not occur between the first capacitor electrode 81 and the source (or drain) region 29' and between the common capacitor electrode 85 and the drain (or source) regions 28, 28'. Also, the silicon oxide films 25 must have a thickness by which capacitance coupling or undesirable direct contact does not occur between the word lines 24' including the gate electrodes 24 and the first and common electrodes 81, 85. Further, the silicon oxide layers 93, 99 in the contact holes 92, 98 must have their thickness from the side walls such that any electrical interaction does not occur between the second capacitor electrode 89 and the first and common capacitor electrodes 81, 85 in the contact hole 92 and between the bit line 91 and the common electrode 85 in the contact holes 98, respectively.

Figure 5A:
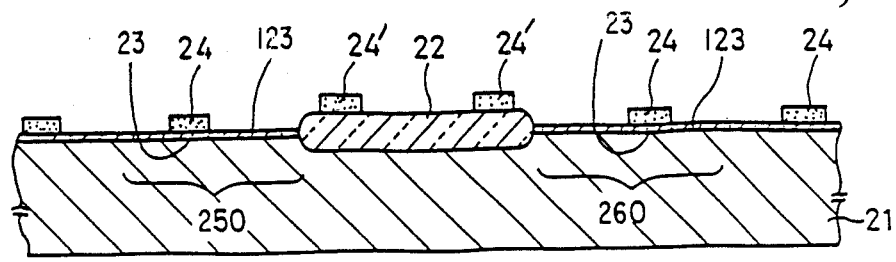
FIGS. 5A to 5H are cross-sectional views showing sequentially the steps of the process for manufacturing the second embodiment.
Figure 5B:
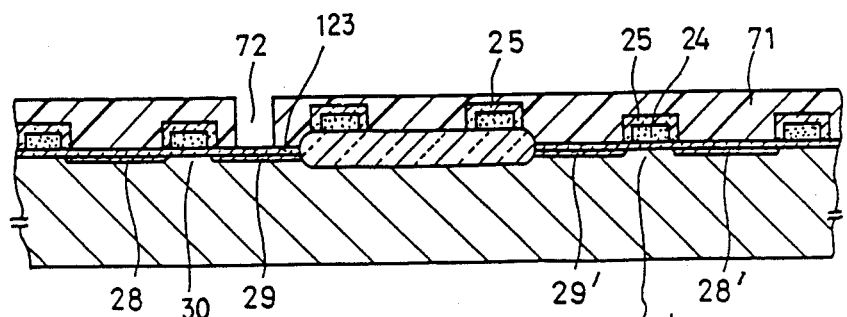
Figure 5C:
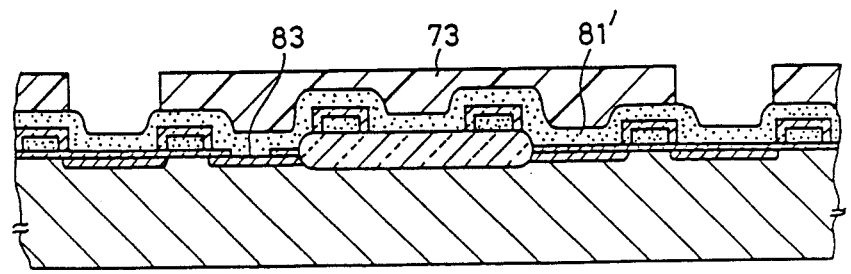
Figure 5D:
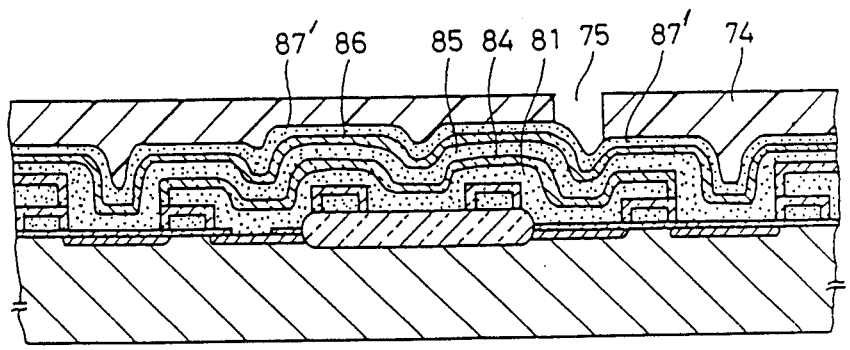
Figure 5E:
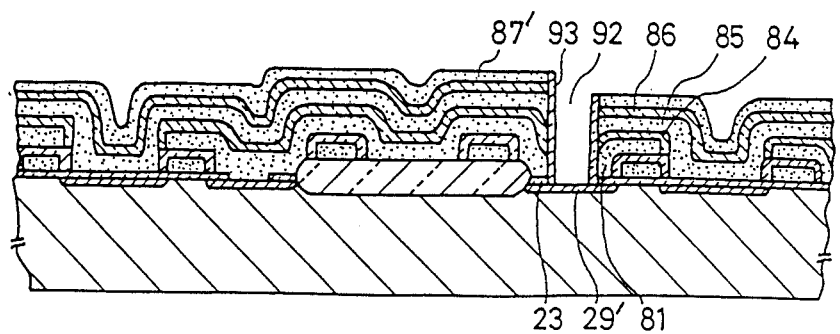
Figure 5F:
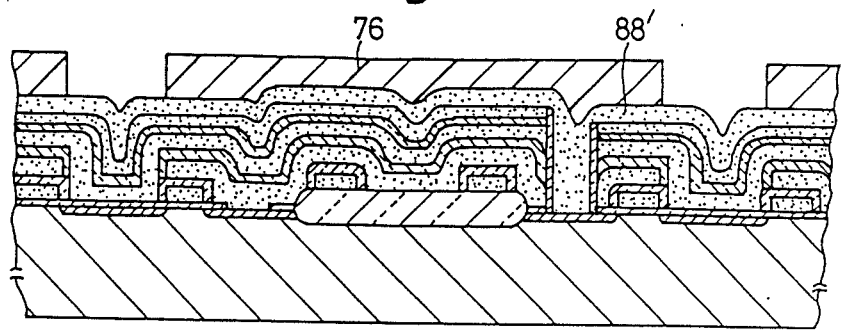
Figure 5G:
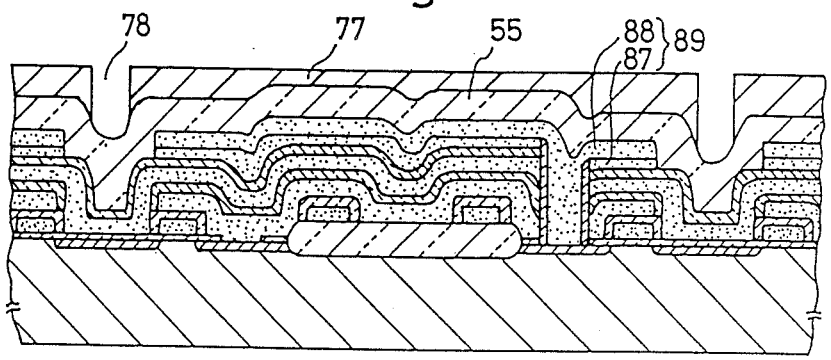
Figure 5H:
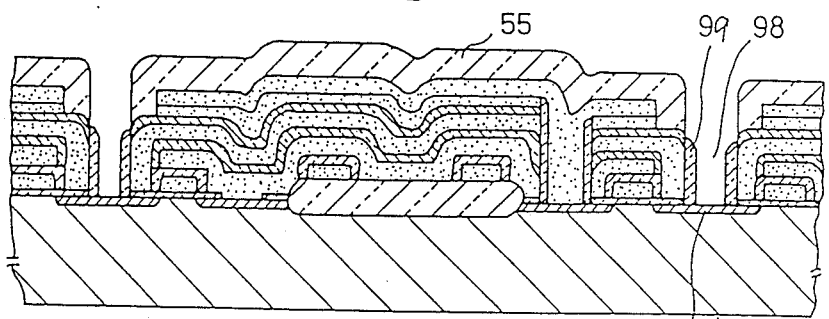

Next, a method of manufacturing the second embodiment will be described. At first, the thick field silicon oxide layer 22 is selectively, thermally formed on the P-type silicon substrate 21 by a conventional art, and on the major surface of the active region, gate insulating films 23 and the silicon oxide layer 123, which is thicker than the gate insulating films 123 although in the drawings drawn as the same thickness, are formed. Then the word lines 24' including gate electrodes 24 are formed by first level polycrystalline silicon layer (FIG. 5A). Next, the N+-type regions 28, 29, 28', 29' serving as source and drain regions are formed through an ion implantation of arsenic or phosphorus ions followed by annealing, by using gate electrodes 24 and the field insulating layer 22 as a mask. After forming silicon oxide films 25 on the gate electrodes; also on the word lines by a thermal oxidation method or a CVD method, a first photoresist mask pattern 71 having an aperture 72 is formed (FIG. 5B). Next, silicon oxide layer 123 is selectively away under the aperture 72 using the first photoresist mask pattern to form the contact hole 83. After removing the first photoresist mask pattern 71, a polycrystalline silicon layer 81' of second level polycrystalline silicon is entirely formed, and N-type impurities are introduced into the silicon layer 81' by a thermal diffusion method or an ion implantation method. Then, a second photoresist mask pattern 73 is formed (FIG. 5C). Next, the first capacitor electrode 81 is formed by selective etching of the silicon layer 81' using the second photoresist mask pattern 73. After removing the mask pattern 73, the first thin dielectric film 84 is formed on the first capacitor electrode 81 by a thermal oxidation method or a CVD method. Then, a third level polycrystalline silicon layer is deposited by CVD method, and N-type impurities are introduced into the silicon layer by a thermal diffusion method or an ion implantation method to form the common capacitor electrode 85. Then the second thin dielectric film 86 is formed on the common capacitor electrode 85 by a thermal oxidation method or a CVD method, and a first polycrystalline film 87' is entirely formed. Then, a third photoresist mask pattern 74 having an aperture 75 is formed (FIG. 5D). Next, the contact hole 92 is formed in the first silicon film 87', in the second dielectric film 86, in the common capacitor electrode 85, in the first dielectric film 84, in the first capacitor electrode 81 and in the silicon oxide layer 123 in sequence under the aperture 75 by using the photoresist pattern 74 as a mask through a reactive anisotropic ion etching method. After removing the photoresist pattern 74, a silicon oxide layer is entirely formed by a thermal oxidation method or a CVD method, and a reactive anisotropic ion etching is conducted to the silicon oxide layer to retain the silicon oxide layer 93 only on the side wall of the contact hole 92 (FIG. 5E). Next, a second polycrystalline silicon film 88' is entirely deposited by a CVD method so as to fill the contact hole 92 completely. Then N-type impurities are introduced into the fourth level polycrystalline silicon layer consisting of films 87', 88' by a thermal diffusion method or an ion implantation method. Then, a fourth photoresist mask pattern 76 is formed (FIG. 5F). Next, the silicon layer is selectively away by using the fourth photoresist mask pattern 76 to form second capacitor electrode 89. After removing the fourth photoresist mask pattern 76, the inter-ply insulating layer 55 is deposited by a CVD method, and a fifth photoresist mask pattern 77 having apertures 78 is formed (FIG. 5G). Thereafter, the contact holes 98 are sequentially formed in the inter-ply insulating layer 55, in the second dielectric film 86, in the common capacitor electrode and the silicon oxide layer 123 in under the apertures 78 by using the photoresist pattern 77 as a mask through a reactive anisotropic ion etching method. After removing the photoresist pattern 77, a silicon oxide layer is entirely formed by a thermal oxidation method or a CVD method, and a reactive anisotropic ion etching is conducted to the silicon oxide layer to retain the silicon oxide layers 99 only on the side walls of the contact holes 98. Then, the metallic bit line 91 is formed on the inter-ply insulating layer 55 and are connected to the common drain (or source) regions 28, 28' through the contact holes 98 to establish the structure shown in FIG. 4.

What is claimed is:

1. A semiconductor memory device having a plurality of semiconductor memory cells of one transistor - one capacitor type comprising:
   a semiconductor substrate of a first conductivity type having a major surface, said substrate including first and second transistor forming portions;
   first and second impurity regions of a second conductivity type opposite to said first conductivity type formed in said major surface of said first transistor forming portion;
   third and fourth impurity regions of said second conductivity type formed in said major surface of said second transistor forming portion;
   a first insulating layer formed on said first to fourth impurity regions;
   a first gate insulating film formed on said major surface between said first and second impurity regions;
   a second gate insulating film formed on said major surface between said third and fourth impurity regions;
   a first gate electrode formed on said first gate insulating film and covered by an insulating film;
   a second gate electrode formed on said second gate insulating film and covered by an insulating film;
   a first capacitor electrode electrically connected to said second impurity region and formed on said first and second transistor forming portions;
   a first dielectric film formed on said first capacitor electrode;
   a common capacitor electrode formed on said first dielectric film;
   a second dielectric film formed on said common electrode;
   a second capacitor electrode electrically connected to said fourth impurity region, formed on said second dielectric film and on said first and second transistor forming portions;
   an inter-ply insulating layer formed on said second capacitor electrode; and
   a bit line formed on said inter-ply insulating layer and electrically connected to said first and third impurity regions;
   whereby a first semiconductor memory cell is constructed by a first switching transistor and a first storage capacitor in which said first switching transistor is constituted of said first impurity region serving as one of source and drain regions, said second impurity region serving as the other of source and drain regions, said first gate insulating film and said first gate electrode, and in which said first storage capacitor is constituted by said first capacitor electrode, said first dielectric film and said common capacitor electrode, and whereby a second semiconductor memory cell is constructed by a second switching transistor and a second storage capacitor in which said second switching transistor is constituted of said third impurity region serving as one of source and drain regions, said fourth impurity region serving as the other of source and drain regions, said second gate insulating film and said second gate electrode, and in which said second storage capacitor is constituted by said second capacitor electrode, said second dielectric film and said common capacitor electrode.

2. A semiconductor memory device of claim 1, in which said second capacitor electrode is stacked on said first capacitor electrode with said first and second dielectric films and a common capacitor electrode interposed therebetween, whereby said first and second capacitors are substantially of a same plan shape.

3. A semiconductor memory device of claim 1, in which said first capacitor electrode is connected to said second impurity region through a first contact hole which is formed in said first insulating layer on said second impurity region, and said second capacitor electrode is connected to said fourth impurity region through a second contact hole which is formed in said second dielectric film, in said common capacitor electrode, in said first dielectric film, in said first capacitor electrode and in said first insulating layer on said fourth impurity region and is surrounded by a second insulating layer covering at least side walls of said common capacitor electrode and of said first capacitor electrode in said second contact hole.

4. A semiconductor memory device of claim 1, in which said gate electrode, said first and second capacitor electrodes and said common capacitor electrode are made of polycrystalline silicon so that a multilayered structure by four levels of polycrystalline silicon is formed on said substrate.

5. A semiconductor memory device of claim 1, in which said first and second transistor forming portions are formed in common in an active region of said substrate which is surrounded by a field insulating layer formed on said major surface of said substrate, and said first and third impurity regions are continuously formed at a center part of said active region to form a common impurity region.

6. A semiconductor memory device of claim 5, in which said bit line is connected to said common impurity region constituted by said first and third impurity regions of said first and second semiconductor memory cells through a third contact hole which is formed in said inter-ply insulating layer, in said second capacitor electrode, in said second dielectric film, in said common capacitor electrode, in said first dielectric film, in said first capacitor electrode and in said first insulating layer on said common impurity region and is surrounded by a third insulating layer at least covering side walls of said common capacitor electrode and of said first and second capacitor electrodes in said third contact hole.

7. A semiconductor memory device of claim 5, in which said first and second capacitor electrodes and said common capacitor electrodes entirely covers said active region with said first and second dielectric film so that said first storage capacitor of said first semiconductor memory cell is entirely formed on said first and second transistor forming portions and said second storage capacitor of said second semiconductor memory cell is entirely formed on said first and second transistor forming portions.

8. A semiconductor memory device of claim 1, in which said first and second transistor forming portions are formed in different active regions of said substrate, respectively, and a field insulating layer is formed on said major surface of said substrate between said first and second transistor forming portions.

9. A semiconductor memory device of claim 8, in which said second and fourth impurity regions are abutted against said field insulating layer, respectively.

10. A semiconductor memory device of claim 9, in which said first and second storage capacitors are formed on said first and second gate electrodes, on said second and fourth impurity regions and on said field insulating layer between said first and second transistor forming portions, respectively, and are absent on said first and third impurity regions where said common capacitor electrode with said second dielectric film is formed.

11. A semiconductor memory device of claim 10, in which said bit line is connected to said first impurity region through a fourth contact hole which is formed in said second dielectric film, in said common capacitor electrode and in said first insulating layer on said first impurity region and is surrounded by a fourth insulating layer at least covering the side wall of said common capacitor electrode in said fourth contact hole, and connected to said third impurity region through a fifth contact hole which is formed in said second dielectric film, in said common capacitor electrode and in said first insulating layer on said third impurity region and is surrounded by a fifth insulating layer at least covering the side wall of said common capacitor electrode in said fifth contact hole.

* * * * *

UNITED STATES PATENT AND TRADEMARK OFFICE
CERTIFICATE OF CORRECTION

PATENT NO. : 4,985,718
DATED : January 15, 1991
INVENTOR(S) : Toshiyuki ISHIJIMA It is certified that error appears in the above-identified patent and that said Letters Patent is hereby corrected as shown below:

Col. 2, line 26, delete "interply" and insert --inter-ply--;

Col. 3, line 60, delete "N+" and insert --$N^+$--;

Col. 6, line 65, delete "interply" and insert --inter-ply--;

Col. 8, line 62, after "selectively", insert --etched--.

Signed and Sealed this

Sixth Day of October, 1992

Attest:

DOUGLAS B. COMER

Attesting Officer   Acting Commissioner of Patents and Trademarks